ELECTRICAL CONTROL APPARATUS

Filed July 9, 1954 2 Sheets-Sheet 1

INVENTOR.
WILLIAM J. POPOWSKY
BY Arthur H. Swanson
ATTORNEY.

ELECTRICAL CONTROL APPARATUS

Filed July 9, 1954 2 Sheets-Sheet 2

INVENTOR.
WILLIAM J. POPOWSKY
BY Arthur H. Swanson
ATTORNEY.

2,847,625
Patented Aug. 12, 1958

2,847,625

ELECTRICAL CONTROL APPARATUS

William J. Popowsky, Philadelphia, Pa., assignor to Minneapolis-Honeywell Regulator Company, Minneapolis, Minn., a corporation of Delaware Application July 9, 1954, Serial No. 442,264

20 Claims. (Cl. 318—28)

A general object of the present invention is to provide a transistor oscillator circuit having particular utility in an electrical transducer. A more specific object of the invention is to provide a transistor oscillator circuit which is useful as a variable impedance suitable for causing a variable current to flow in either a direct or an alternating current circuit in accordance with the oscillatory conditions of the oscillator circuit.

In accordance with the principles of the present invention, there is provided an oscillator circuit which is operative to produce an output current flow which will follow an electrical input signal or an electro-mechanical input signal. The output current of the oscillator circuit may be arranged for use in balancing the input either electrically or by an electro-mechanical force balancing means.

Another object of the present invention is to provide an improved transistor oscillator whose variable impedance characteristics are well adapted for use in an electrical transducer.

Another object of the present invention is to provide a transistor oscillator having variable impedance characteristics which has sufficient current flow changes with input signal to provide a direct source of feedback energy usable either electrically or in an electro-mechanical feedback apparatus.

The principal form of the present invention employs a transistor connected to a tapped inductance feedback coil which forms a part of an oscillator circuit. Means are provided for varying the amount of feedback in the oscillator circuit by varying the signal which is effective in this coil. The signal may be varied by varying the inductance of the coil or by placing another variable impedance in the oscillator circuit which is effective to vary the magnitude of signal available at the feedback coil. The transistor current flow changes resulting from the variations in feedback signal may be used to indicate the magnitude of the input signal to the oscillator. The impedance change of the transistor producing the variable current flow may conveniently be used to vary the current flow in a force balancing coil, a control winding of a reversible motor, or other types of current utilization apparatus.

It is accordingly a more specific object of the present invention to provide a transistor oscillator having a tapped inductive feedback coil with the feedback being effective to vary the impedance of the emitter-collector electrode path of the transistor of the oscillator and with this impedance variation being used to control the current flow in the utilization device.

Another more specific object of the present invention is to provide a transistor oscillator having a tapped inductive feedback coil with a variable impedance associated therewith to control the feedback signal in the inductive coil and thereby the impedance of the emitter-collector electrode path of the transistor.

Still another more specific object of the present invention is to provide a transistor type of transducer having a transistor oscillator whose current flow may be made to follow the magnitude of an input signal and whose current flow may be used in a manner to balance the input signal.

A still further object of the present invention is to provide in conjunction with each of the foregoing mentioned objects a transistor oscillator which is stable and whose output impedance is relatively independent of temperature variations.

The various features of novelty which characterize the invention are pointed out with particularity in the claims annexed to and forming a part of this specification. For a better understanding of the invention, its advantages, and specific objects attained with its use, reference should be had to the accompanying drawings and descriptive matter in which there is illustrated and described preferred embodiments of the invention.

Of the drawings:

Fig. 1 represents one form of the present invention utilized as a motion to current transducer in an electrical force balancing type of apparatus;

Fig. 1*a* shows a detail of a portion of Fig. 1;

Fig. 2 shows one form of the apparatus applied in a circuit for controlling a reversible motor;

Fig. 2*a* shows representative wave form conditions occurring in a control winding of the motor of Fig. 2;

Figures 1, 1A:
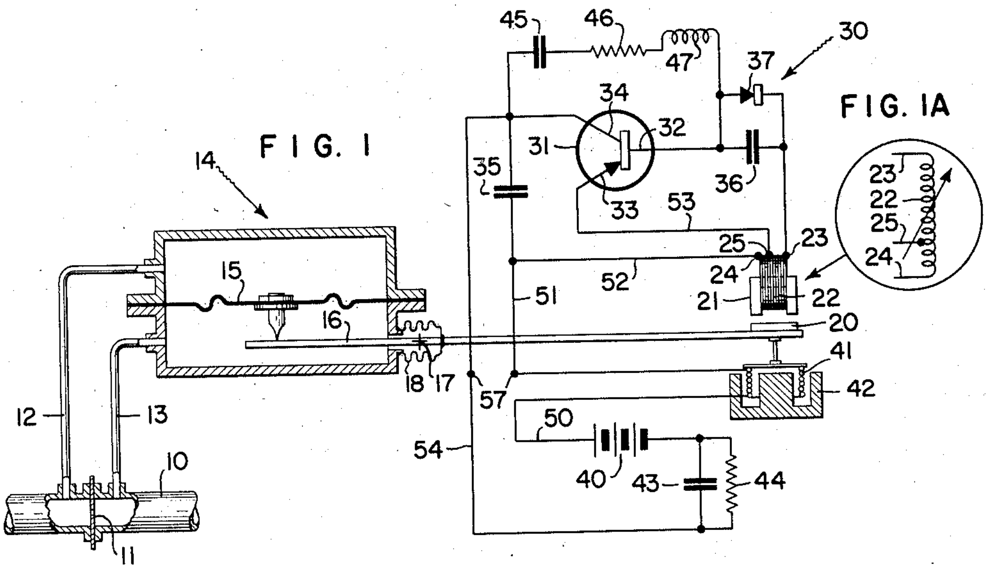

Referring first to Fig. 1, the numeral 10 represents a flow line having an orifice 11 therein. Spaced on either side of the orifice 11 are a pair of pressure takeoff connections 12 and 13 which are connected to a differential pressure measuring apparatus 14. This apparatus includes a resilient diaphragm 15 which is adapted to be deflected in accordance with the pressure variations from the input pressure lines 12 and 13. The forces from the diaphragm 15 resulting in the differential pressure between the input lines 12 and 13 is effective to create a force upon a beam 16 which is pivoted at 17 and extends from the internal portion of the pressure sensing chambers by way of a sealing bellows 18.

The beam 16 at its outer end carries a magnetic member 20 which cooperates with a magnetic core structure 21 having a coil 22 wound thereon.

As shown in Fig. 1*a*, the coil 22 is a tapped coil having end terminals 23 and 24 and a tap 25. The inductance of the coil 22 is effectively varied by the relative positioning of the magnetic member 20 relative to the core structure 21. The coil 22, in Fig. 1, is the principal oscillation intensity control means for the oscillator circuit 30. This oscillator includes a transistor 31 having a base electrode 32, an emitter electrode 33, and a collector electrode 34. The emitter electrode 33 is connected to the tap 25, and the collector electrode 34 is connected to the end terminal 24 by way of a radio frequency bypass condenser 35. The base electrode 32 is connected to the terminal 23 by way of a condenser 36 having a biasing diode connected in parallel therewith. The need for the biasing diode 37 is dependent in part upon the magnitude of the $I_{co}$ in the transistor 31. A transistor having a high $I_{co}$ will not require the presence of the biasing diode 37 while a transistor having a low $I_{co}$ will require the presence of the biasing diode 37.

A battery 40 is shown as the source of power for the oscillator circuit 30 and in series with this battery 40 is a force balancing feedback coil 41 which is adapted to cooperate with a permanent magnet 42 and create a variable force on the beam 16 to balance the input forces from the diaphragm 15 in accordance with the current flow variations in the output of the oscillator 30. Also in series with the battery 40 is a suitable utilization device represented by a resistor 44 having a condenser 43 in parallel therewith.

When the apparatus is used as a closed loop current force balance apparatus as shown in Fig. 1, it is sometimes necessary to provide a further stabilizing feedback which takes the form of a condenser 45, resistor 46, and a coil 47 connected in series between the base electrode 32 and the collector electrode 34.

In considering the operation of Fig. 1, it should first be noted that when the apparatus is connected as shown upon the drawing, there will normally be a tendency for the oscillator 30 to be in oscillation. The initial oscillation of the present oscillator is started by the $I_{co}$ normally tending to flow in the collector and base electrode circuit. This current flow upon seeing the high impedance due to the diode 37 is effective to flow in the collector-emitter circuit and thereby create an apparent bias on the base electrode 32 which is in a direction to create an apparent input signal which will start the circuit into oscillation. The direct current flow through the oscillator 30 from battery 40 may be traced from the positive terminal of the battery through lead 50, force balancing coil 41, lead 51, lead 52, terminal 24, coil 22, tap 25, lead 53, emitter 33, collector 34, and lead 54 back to the load resistor 42 to the negative terminal of the battery 40. The oscillating current flow of the oscillator 30 may be traced from the collector electrode 34 through condenser 35, lead 52, terminal 24, coil 22, tap 25, and lead 53 to the emitter 33. The feedback which sustains oscillations is produced by the coil 22 due to the alternating current passing through the lower portion of the coil 22, as viewed in Fig. 1*a*. This induces a voltage in the upper portion of the winding between terminal 23 and tap 25 and since terminal 23 is connected to the base 32 by way of the bypass condenser 36, the circuit will stay in oscillation.

The intensity of the oscillations of the oscillator 30 will determine the average direct current drawn from the battery 40 and in effect the emitter-collector electrode path of the transistor 31 acts as a variable impedance insofar as the terminals 57 of the oscillator are concerned. The intensity of the oscillations is regulated by varying the inductance of the coil 22 and this is accomplished by varying the air gap between the magnetic member 30 and the magnetic core structure 21. For a particular input force to the beam 16 and the diaphragm 15, there will be a corresponding output current flowing from the battery 40 to the load resistor 44. The current flow through the force balancing coil 41 will create a force upon the beam 16 which will tend to balance the input force from the diaphragm 15.

When the magnetic member 20 is moved away from the core structure 21, the impedance of the coil 22 will increase and this increase may be effective in the oscillator circuit to increase the current flow conditions in the oscillator depending upon the portion of the resonant curve over which the oscillator is being tuned by the movement of the member 20 relative to the structure 21. If the circuit is arranged so that the current flow increases with a lowering of the impedance caused by the movement of the member 20 toward the core structure 21, this increase in current flow will be effective in the coil 41 to create a balancing force upon the beam 16 which will move the beam so that the magnetic member 20 will be moved away from the core structure 21 until a balance condition is achieved. It will be readily apparent that if the input force to the beam 16 is decreased, there will be less output current flowing in the circuit tending to balance the input force and the apparatus will come to a balanced condition with the output current flow being representative of the differential pressure condition existing on the diaphragm 15.

In the event that the conditions associated with the force balancing action of the apparatus of Fig. 1 are such as to be somewhat unstable since the circuit is a closed loop circuit, it is but necessary to provide the stabilizing feedback circuit formed by the condenser 45, resistor 46, and the choke coil 47. Since the transistor 31 acts both as an oscillator and as an amplifier simultaneously, it is desirable not to effect its oscillator characteristics and it is desirable to modify the amplifier characteristics to restore stability. Thus, this feedback circuit between the collector electrode 34 and the base electrode 32 is degenerative on the amplifier characteristics of the transistor 31 and the circuit constants may be so selected that for a particular combination, the instability may be removed.

Figure 2:
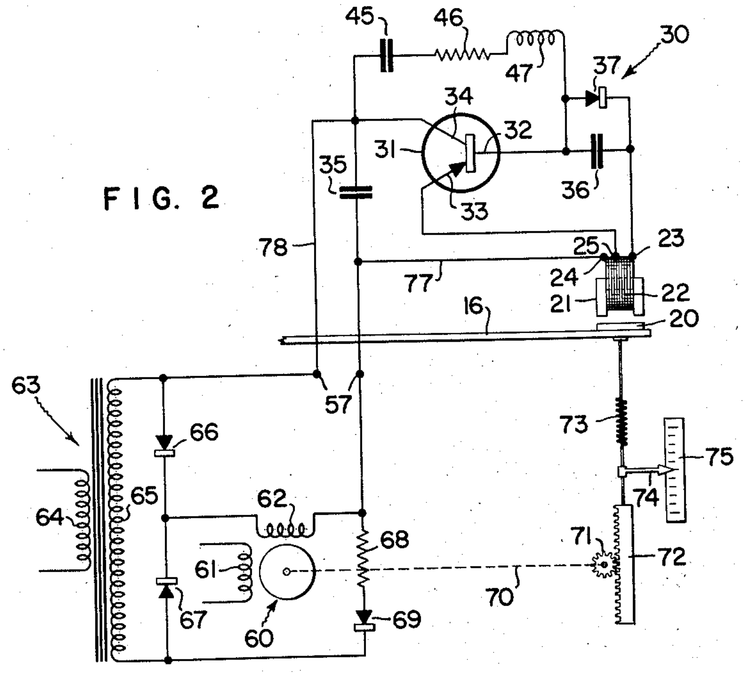

The apparatus of Fig. 2 shows the basic transducer unit of Fig. 1 applied to a circuit for controlling the current flowing in the winding of a reversible motor 60. The oscillator circuit and the associated transducer elements correspond to those of Fig. 1 and carry corresponding reference characters.

The motor 60 includes a pair of control windings 61 and 62. The motivating power for the motor 60 is derived from a transformer 63 having a primary winding 64 and a secondary winding 65. Connected across the secondary winding 65 are a pair of diodes 66 and 67. Also connected across the secondary 65 are the output terminals 57 of the transducer of the present apparatus and a resistor 68 in series with a further diode 69. The winding 62 is connected between the junction of the diodes 66 and 67 and between the junction of the terminal 57 and resistor 68.

The motor output may be conveniently coupled by suitable means 70 to a pinion gear 71 which cooperates with a rack 72. The rack 72 may provide means for acting upon a resilient member 73 for force balancing the beam 16. A pointer 74 may also cooperate with a suitable indicator dial 75 to provide a visual indication of the output from the transducer.

Figure 2A:
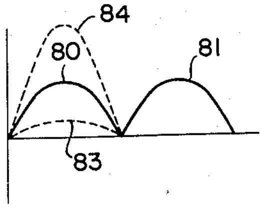

In considering the operation of Fig. 2, it will first be assumed that the impedance looking into the terminals 57 toward the oscillator 30 is substantially the same as the impedance of the diode 66. When the impedances are balanced, the control winding 62 of the motor 60 will have a current flowing through the winding every half cycle and the current flow will be of equal amplitude and of the same polarity as represented by the curves 80 and 81 of Fig. 2*a*. The current flow for the first half cycle when the upper terminal of the secondary 65 is positive with respect to the lower terminal may be traced from the upper terminal through the diode 66, winding 62, resistor 68, diode 69, to the lower terminal of the secondary 65. On the next half cycle of the alternating current supply voltage of the transformer 63, the lower terminal of the secondary 65 will be positive with respect to the upper terminal and the current flow circuit may be traced from the lower terminal through the diode 67, winding 62, lead 76, lead 77, terminal 24, coil 22, terminal 25, emitter 33, collector 34, and lead 78 to the upper terminal of the secondary 65. As long as the amplitudes of the pulses 80 and 81 shown in Fig. 2*a* are equal, the motor 60 will remain stationary. When the impedance looking into the input terminals 57 becomes larger than the impedance of the rectifier 66, there will be a smaller amount of current flow passing through the winding 62 during the half cycle when the lower terminal of the secondary 65 is positive. This will result in the wave form represented by the numeral 83 in Fig. 2*a*. The combined action of the wave 83 and that of the wave 81 gives a resultant alternating current component of a phase which will drive the motor 60 in a direction so that it will change the biasing action of the force balancing spring 73 until a balance is reached.

If the impedance looking into the terminals becomes lower, the current pulse through the winding 62 during the half cycle, when the lower end of the secondary 65 is positive, will be larger as represented by the curve 84 shown in Fig. 2*a*. This current pulse 84 when combined with the other current pulse 81 will yield an alternating current signal whose fundamental component will be 180° reversed from the signal present when the impedance looking into terminals 57 is high. The resultant signal will be effective to drive the motor 60 in the reverse direction and again the motor will be effective through the resilient member 73 to effect a force balancing of the beam 16.

It will be readily apparent that the apparatus of Fig. 2 is effective to produce an output controlling action on the rack 72 as indicated by the indicator 74 moving with respect to dial 75 which will be proportional to the input force acting upon the beam 16.

Figure 3:
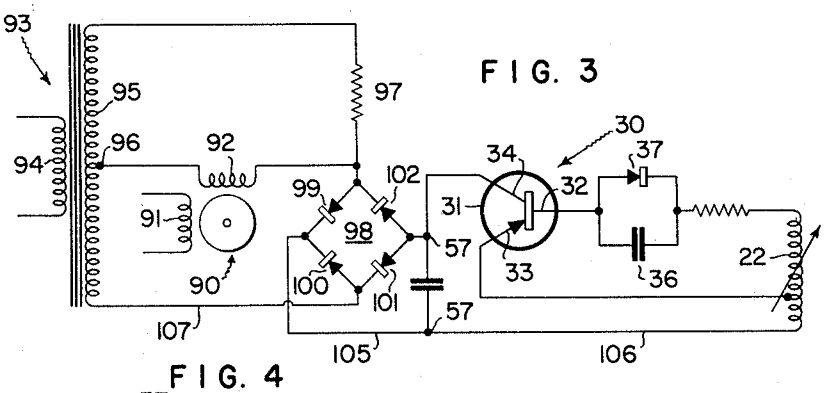
Fig. 3 shows a modified form of motor control apparatus.

Fig. 3 represents a modified form of motor control circuit wherein it is possible to achieve full wave control for a reversible motor. Here, the numeral 90 represents a reversible motor having a line winding 91 and a control winding 92. The motivating power for the control winding 92 is derived from a transformer 93 having a primary winding 94 and a secondary winding 95, the latter of which is tapped at 96.

Connected to the ends of the secondary winding 95 is a resistor 97 and a rectifier circuit 98 comprising a plurality of rectifier units 99, 100, 101, and 102. Connected across the conjugate arms of the bridge 98 is a transducer unit of the type previously described in connection with Fig. 1. This transducer carries reference characters which correspond to the components of Fig. 1.

In considering the operation of Fig. 3 it should be noted that the rectifier network with the transducer connected thereto acts as a variable impedance in a bridge network which is formed by the secondary winding 95, the resistor 97, and the rectifier network 98. The output terminals of this last bridge network is between the tap 96 and the junction between the resistor 97 and the network 98. The impedance of the rectifier network 98 will be varied in accordance with the impedance looking into the input terminals 57 of the transducer. The current flow in this instance will pass through the transistor 31 regardless of which half cycle is appearing across the input terminals of the rectifier network 98. Thus, if the upper terminal of the secondary 95 is positive with respect to the lower terminal, there will be a current flow that may be traced through the resistor 97, rectifier 99, lead 105, lead 106, coil 22, emitter 33, collector 34, rectifier 101, and lead 107 to the lower terminal of the secondary 95. On the next half cycle when the lower terminal of the secondary 95 is positive with respect to the upper terminal, a current flow may be traced through the lead 107, through rectifier 100, lead 105, lead 106, coil 22, emitter 33, collector 34, rectifier 102, and resistor 97 back to the upper terminal of the secondary 95. Since the oscillatory condition of the oscillator 30 may be used to vary the impedance looking into the input terminals 57, it will be readily apparent that the impedance presented by the rectifier circuit 98 may be made to vary in acordance with the impedance looking into the transducer at terminals 57. This latter impedance is, of course, variable in accordance with the oscillation intensity as controlled by the adjustment of the inductor coil 22.

It will be readily apparent that the tapped secondary winding 95 and the resistor 97 and rectifier circuit 98 form a bridge circuit. When the impedance of the resistor 97 is equal to that of the rectifier circuit 98, there will be no current flowing through the motor control winding 92 since the point 96 will be at the same potential as the junction between the resistor 97 and the circuit 98. If the impedance of the rectifier circuit 98 is made to vary with respect to that of the impedance of resistor 97, this last mentioned bridge circuit will become unbalanced and there will be a current flow which will pass through the control winding 92 and the phasing of this current flow will be either in phase or 180° out of phase depending upon the direction in which the impedance represented by the circuit 98 is varied with respect to that of the resistor 97. With the reversibly phased alternating current signal available on the control winding 92, it is possible to reversibly control the operation of the motor 90 and this motor 90 may be used in any desirable manner, such as in an apparatus of the type shown in Fig. 2.

The advantage of the circuit of Fig. 3 over that of Fig. 2 is that the apparatus shown in the latter figure utilizes the full alternating current signal supplied by the transformer 93 in supplying the driving energy for the motor 90.

Figure 4:
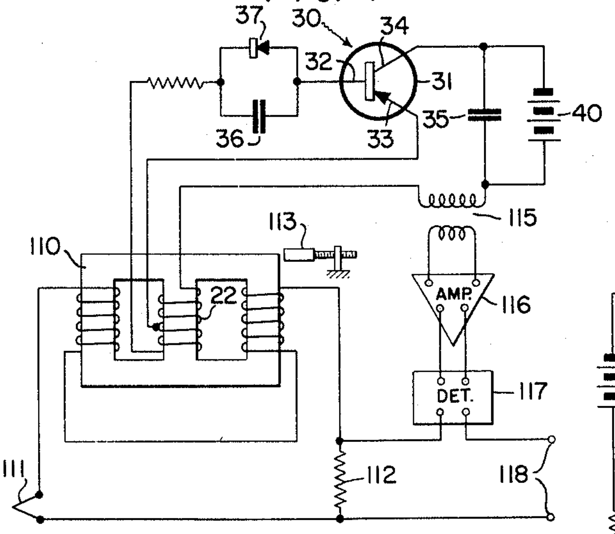
Fig. 4 shows a form of the apparatus having an electrical input signal for varying the impedance of a coil associated with the oscillator of the present apparatus.

Referring now to Fig. 4, there is shown a modified form of apparatus wherein the oscillator feedback control coil 22 is formed on a leg of a magnetic core structure 110 with the saturation of the core being controlled by an external control element such as a thermocouple 111. In series with the thermocouple 111 is a feedback resistor 112. If desirable, a suitable permanent magnet bias may be supplied by a magnetic member 113 which is relatively adjustable with respect to the core structure 110.

The oscillator circuit 30 is basically the same as that of the oscillator of Fig. 1 and corresponding components carry corresponding reference characters. For detecting the intensity of oscillations in the circuit of Fig. 4, there is provided a transformer 115 having a primary winding in series with the alternating current path of the oscillator 30 and a secondary winding connected to an amplifier 116 and a detector 117, the latter of which has a direct current output which is fed through the resistor 112, provides a rebalancing signal, and appears as an output signal on output terminals 118.

The operation of Fig. 4 is fundamentally the same as that of the previous figures. Here, the inductance of the feedback coil 22 is regulated by the current flow conditions originating in thermocouple 111 and the feedback resistor 112. Since the inductance is varied, the oscillation intensity of the oscillator 30 will also vary. The magnitude of the oscillations will be amplified and detected by the detector 117 and will produce an output current flow which is proportional to the input voltage originating from the thermocouple 111. An electrical balancing will be effected by current flowing through the resistor 112 which is connected in series with the thermocouple 111. It will be readily apparent that changes in voltage of the thermocouple 111 will produce corresponding changes in the output of the oscillator which will be proportional to the input signal from the thermocouple 111.

Figure 5:
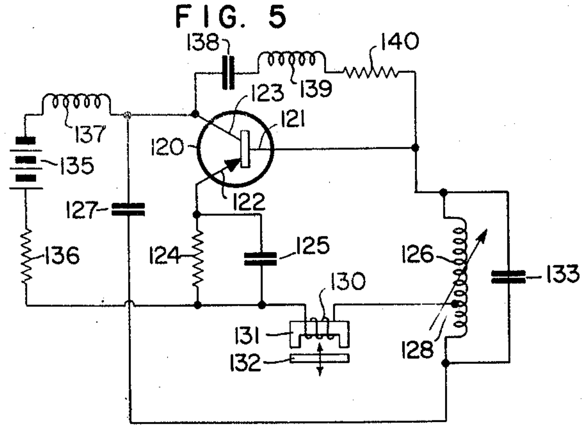
Fig. 5 shows a modified form of oscillator circuit adapted for use in the various apparatus configurations shown in the foregoing figures.

Fig. 5 represents a modified form of oscillator circuit incorporating the principles of the present invention. In this circuit, there is included a transistor 120 having a base electrode 121, an emitter electrode 122, and a collector electrode 123. Connected to the emitter electrode 122 is a resistor 124 having a condenser 125 in parallel therewith. A feedback coil 126 has its upper terminal connected to the base electrode 121 and its lower terminal connected to the collector electrode 123 by way of a condenser 127. A tap on the coil 126 at 128 is connected to the emitter electrode 122 by way of a further inductive coil 130 and resistor 124. The inductive coil 130 is wound upon a magnetic core structure 131 and cooperating with the structure 131 is a further movable magnetic member 132, the latter of which is used to vary the air gap of the core structure 131 and thereby the inductance of the coil 130. In parallel with the coil 126 is a condenser 133.

Power is supplied to the transducer 120 by a battery 135 which has a resistor 136 and a choke coil 137 connected in series therewith. A stabilizing feedback may be applied to the apparatus by connecting a condenser 138, a choke coil 139, and a resistor 140 in series between the collector electrode 123 and base electrode 121.

The circuit of Fig. 5 may also be supplied with a biasing diode in the base electrode circuit with a condenser in parallel therewith, as shown in Fig. 1. However, transistors which have a suitable $I_{co}$ have characteristics to start oscillation without the addition of the biasing diode and consequently it is possible to omit such from the circuit.

In considering the operation of Fig. 5, it will be noted that both the coil 126 and the coil 130 are adjustable. In this form of the apparatus, it is generally expedient to adjust the coil 126 in accordance with the particular characteristics of the transistor 120. Variations in output current through the load resistor 136 may be produced by the inductive coil 130 as its impedance is varied by the movement of the magnetic member 132 relative to the core structure 131. The normal direct current flow for the circuit may be traced from the positive terminal of the battery 135 through the load resistor 136, resistor 124, emitter 122, collector 123, and choke coil 137 back to the battery 135.

The alternating current path of the oscillator may be traced from the collector electrode 123 through condenser 127, coil 126, tap 128, coil 130, condenser 125, to the emitter electrode 122. The current flowing through the lower portion of the coil 126 between the lower terminal and the tap 128 is effective to induce a voltage in the upper half of the coil 126 which voltage is fed to the base electrode 121 in a regenerative manner so as to sustain oscillations.

In order to vary the intensity of the oscillations and thereby the output current flowing through the load resistor 136, the magnetic member 132 is moved relative to the core structure 131. When the member is moved closer to the core structure 131, the impedance will be lowered and there will be a smaller signal voltage drop across the coil 130. The smaller signal across the coil 130 will provide a larger signal across the lower portion of the coil 126 and consequently there will be a higher voltage appearing on the base electrode 121. This will mean that the intensity of the oscillations will increase and there will be a higher current flow originating from the battery 135 and passing through the resistor 136. It will be noted that the coil 130 by itself also produces a means for feeding back a portion of the signal in that the signal voltage drop across the coil 130 will be applied between emitter 122 and the base electrode 121. If the impedance of the coil 130 is increased, there will be a smaller amount of voltage available in the feedback circuit and a consequent reduction in the oscillation intensity and the current flowing through the load resistor 136.

The circuit of Fig. 5 may well be interchanged for any of the circuits shown in the previous figures with the principles applicable to the present circuit being taken into account. The circuit of Fig. 5, as well as that of the previous figures, may also be so arranged that the current flow through the sensing element may create a force upon the cooperating air gap regulating member which will oppose any applied force. In other words, in Fig. 5, if there is a force tending to move the member 132 toward the core structure 131, the resultant change in current flow from this input force may be opposed by a corresponding feedback force resulting from the oscillation current flowing through the coil 130. To enhance this feedback action, it is possible to connect the load resistor 136 to the lower terminal of the coil 126 so that all of the direct current as well as the oscillator alternating current flows through the motion detector coil 130. This will mean that there will be a larger force available for force balance purposes.

The core structure 131 and the cooperating magnetic member 132 may conveniently be formed of ferrite with a temperature characteristic which will tend to compensate current variations resulting from changes in the temperature of the transistor. This may likewise be applicable to the previously discussed figures.

Figure 6:
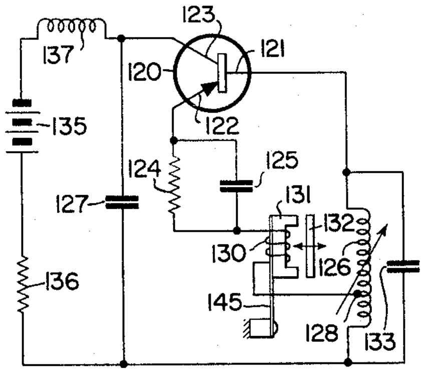
Fig. 6 shows a further modified form of the oscillator circuit.

The modification of Fig. 6 shows a representative means for providing circuit feedback at the motion detector portion of Fig. 5 with the principles being adapted to any of the other previous figures at their respective motion detectors. It has been found that by providing means for producing a negative feedback that the effects of temperature, line voltage changes, transistor shifts and the like may be minimized. In this modification, the coil 130 and core 131 are carried by a resilient member 145. This member permits the core 131 to follow the movements of the moving plate 132 due to the magnetic attraction between the two elements.

It will be noted in Fig. 6 that the direct current for the transistor 120 flows through the coil 130. This current flow causes the core 131 to be moved toward the plate 132 and in so moving there is an effective negative feedback. The input current is effectively a function only of the displacement and the feedback. The gain in the forward loop of the circuit, which is affected by temperature, line voltage, and the like is negligible in its effect upon the output current when the feedback is large. Thus, the effects of line voltage and temperature are minimized. An additional advantage of this form of the apparatus is the increased linearity of current flow change resulting from a linear motion input. While the forward loop gain may be decreased in this form of the apparatus, this is generally not objectionable where there is a large amount of input motion signal available.

It will be readily apparent that the motion plate 132 may also be carried by a resilient member. When so carried the negative feedback action will be the same as that described above. This may also be achieved in an apparatus as shown in Fig. 1 by making the beam 16 of a material which will have a predetermined measure of resiliency.

From the foregoing it will be seen that there has been provided a new and novel type of transducer apparatus which is well adapted to many forms of control apparatus. Further, the apparatus has been shown in its preferred forms to be conveniently stabilized and temperature compensated.

While, in accordance with the provisions of the statutes, there has been illustrated and described the best forms of the embodiments of the invention known, it will be apparent to those skilled in the art that changes may be made in the forms of the apparatus without departing from the spirit of the invention as set forth in the appended claims and that in some cases certain features of the invention may be used to advantage without a corresponding use of other features.

Having now described my invention, what I claim as new and desire to secure by Letters Patent is:

1. A transducer comprising, a transistor oscillator having a tapped inductance coil, a transistor having a base electrode, emitter electrode and collector electrode, said emitter electrode being connected to the tap of said coil and said base and collector electrodes being connected to the ends of said inductance coil, variable responsive means for varying the signal feedback amplitude of said coil and thereby the amplitude of oscillation of said oscillator, said variation in oscillation amplitude producing a corresponding variation in the flow of direct energizing current to said oscillator and means responsive to said variations in direct current flow connected to said oscillator.

2. A transducer comprising a transistor oscillator having a tapped inductance coil, a transistor having a base electrode, emitter electrode and collector electrode, said emitter electrode being connected to the tap of said coil and said base and collector electrodes being connected to the ends of said inductance coil, variable responsive means for varying the signal feedback amplitude of said coil and thereby the amplitude of oscillation of said oscillator, and means connected to said oscillator and to said variable responsive means, said last named means having an electrical output which is effective as a balancing means for said variable responsive means.

3. A variable control apparatus comprising, a transistor having a base electrode, emitter electrode, and collector electrode, a variable inductance coil having a tap thereon, means connecting the base electrode and collector electrode to the ends of said coil, means connecting the tap to said emitter electrode, said transistor when so connected to said coil forming an oscillator circuit, and a pair of output terminals connected to said emitter and collector electrodes, the impedance of said collector and emitter electrode circuit being variable with the variations in the oscillations caused by variations of said inductance coil.

4. A variable control apparatus comprising, a transistor having a base electrode, emitter electrode, and collector electrode, a variable inductance coil having a tap thereon, means connecting the base electrode and collector electrode to the ends of said coil, biasing means comprising a rectifier having a condenser in parallel therewith connected in the base electrode circuit, and a stabilizing feedback circuit comprising a resistor, condenser, and inductance connected in series between the base electrode and collector electrode, means connecting the tap to said emitter electrode, a condenser connecting said emitter electrode to said collector electrode, said transistor when so connected to said coil and said condenser forming an oscillator circuit, and a pair of output terminals connected to said emitter and collector electrode, the impedance of said collector and emitter electrode circuit being variable with the variations in the oscillations caused by variations of said inductance coil.

5. In an apparatus for producing a variable direct current current flow in accordance with a change in magnitude of an input variable, the combination comprising, an oscillator circuit including a transistor having a base electrode, an emitter electrode, and a collector electrode, a tapped inductance coil, means connecting said emitter electrode to a tap on said coil, means connecting said base electrode and said collector electrode to the ends of said coil, a condenser connected in the connection of said collector electrode to one end of said coil, and an oscillation amplitude controlling impedance connected in the connection between said emitter and said tap.

6. Apparatus as defined in claim 5 wherein said oscillation amplitude controlling impedance comprises an inductance coil having an iron core with a cooperating movable member for varying the inductance of said coil.

7. Apparatus as defined in claim 5 wherein said transistor has power supplied thereto by a source of power connected to the emitter and collector electrodes independently of the oscillation amplitude controlling impedance.

8. Apparatus as defined in claim 5 wherein said oscillation amplitude controlling impedance includes a ferrite core structure whose temperature characteristics compensate for temperature changes in said transistor current flow.

9. In apparatus for controlling the operation of a reversible alternating current motor, the combination comprising, an asymmetrically conductive alternating current phase control circuit, a motor control winding connected to said phase control circuit and adapted to have the current flow therethrough regulated by the impedance condition of said phase control circuit, and means for regulating the impedance of said phase control circuit comprising, a transistor oscillator having its emitter-collector path connected to said phase control circuit, and an oscillation producing circuit connected as a part of said transistor oscillator, said circuit including a variable impedance which is effective to vary the amplitude of the oscillations of said oscillator and thereby the impedance of the emitter-collector path.

10. Apparatus for controlling a reversible motor comprising, a first pair of asymmetrically conductive devices connected in series across an alternating current source, a second pair of asymmetrically conductive devices connected in series across said alternating current source, one of said asymetrically conductive devices comprising a transistor oscillator whose oscillation amplitude is regulated in accordance with the magnitude of a variable, and a control winding of said motor connected between the junction of each of said pair of asymmetrically conductive devices, said control winding having an applied alternating current phase relation regulable by the oscillation intensity of said transistor oscillator.

11. Electrical transducing apparatus comprising, a transistor, an oscillation producing circuit means connected to said transistor, an inductive feedback control element included in said circuit means, said inductive element comprising an iron core structure which is saturable in accordance with the magnitude of an input electrical signal, and current responsive means connected to respond to the current flow conditions through said transistor.

12. Apparatus as defined in claim 11 wherein said inductive element has magnetic biasing means positioned adjacent thereto.

13. Apparatus as defined in claim 11 wherein said current responsive means has an output signal which is applied to said inductive element to balance said input signal.

14. A force to electric transducer comprising, a magnetic core structure having a coil wound thereon, an input force actuated magnetic member positioned adjacent said core structure, an oscillator comprising a resonant circuit connected to a transistor, means connecting said coil to said resonant circuit so that the oscillatory signal of said oscillator will pass therethrough, said signal creating a force on said magnetic member in opposition to the input force to said magnetic member, and oscillator current responsive means connected to said transistor to indicate the magnitude of said input force to said magnetic member.

15. Apparatus as defined in claim 14 wherein said core structure is supported by a resilient member to provide a predetermined amount of negative feedback.

16. Apparatus as defined in claim 14 wherein said magnetic member is carried by a resilient member which deflects when subjected to a force.

17. A transducer comprising, a transistor oscillator having a tapped reactive impedance divider, a transistor having an emitter electrode connected to the tap of said divider, a base electrode connected to one end of said divider, and a collector electrode connected to the other end of said divider so that a regenerative signal will be applied to said base electrode, and a variable feedback control impedance connected between said tap and said emitter, said impedance regulating the amplitude of oscillation of said oscillator.

18. An electrical transducer comprising a source of power, a regulable transistor oscillator characterized by its output impedance on a pair of output terminals being variable in accordance with the magnitude of a variable, a pair of electrical conductors connecting said source to said oscillator output terminals to supply all the power thereto, and signal utilization means responsive to current variations in said oscillator connected in series with one of said pair of connecting leads.

19. An electrical transducer comprising a transistor oscillator having a tapped inductance coil, a transistor having a base electrode, emitter electrode, and collector electrode, said emitter electrode being connected to the tap of said coil and said base and collector electrodes being connected to the ends of said inductance coil, variable responsive means including a movable member for varying the signal feedback amplitude of said coil and thereby the amplitude of oscillation of said oscillator, a two terminal source of power connected to said oscillator so that variations in oscillation of said oscillator produce variations in the current flowing from said source, and means responsive to the current flowing from said source connected to produce a balancing force on said movable member.

20. A transducer comprising a transistor oscillator having a tapped inductance coil, a transistor having a base electrode, an emitter electrode and a collector electrode, feedback means connecting said emitter electrode to the tap of said coil, said base and collector electrodes being connected to the ends, respectively, of said inductance coil, said feedback means including variable inductive impedance means for varying the amplitude of the feedback signal to thereby vary the amplitude of oscillation of said oscillator, a source of direct current connected in circuit to energize said oscillator, said oscillator comprising means for varying the flow of said direct current from said source in response to said variations in the amplitude of said oscillation, and output means coupled to said direct current circuit and responsive to said variations in direct current flow.

References Cited in the file of this patent

UNITED STATES PATENTS

| | | |
|---|---|---|
| 2,320,881 | Newton | June 1, 1943 |
| 2,457,792 | Wild et al. | Dec. 28, 1948 |
| 2,530,109 | Wild | Nov. 14, 1950 |
| 2,681,996 | Wallace | June 2, 1954 |

FOREIGN PATENTS

| | | |
|---|---|---|
| 708,161 | Great Britain | Apr. 28, 1954 |